United States Patent [19]
Reynolds et al.

[11] Patent Number: 5,547,537
[45] Date of Patent: Aug. 20, 1996

[54] CERAMIC CARRIER TRANSPORT FOR DIE ATTACH EQUIPMENT

[75] Inventors: Edward P. Reynolds, Philadelphia; Natale F. Tinnerino, Doylestown, both of Pa.; Walter P. Schiefele, Sebastian, Fla.

[73] Assignee: Kulicke & Soffa, Investments, Inc., Wilmington, Del.

[21] Appl. No.: 253,579

[22] Filed: Jun. 3, 1994

Related U.S. Application Data

[63] Continuation of Ser. No. 885,849, May 20, 1992, abandoned.

[51] Int. Cl.⁶ .............................. B23B 35/00; B23P 19/00
[52] U.S. Cl. .......................... 156/351; 156/358; 156/362; 156/538; 29/740; 29/742; 29/759
[58] Field of Search ....................... 29/739, 740, 742, 29/759, 832, 833, 834, 721; 156/64, 351, 358, 362, 363, 538, 578

[56] References Cited

U.S. PATENT DOCUMENTS

| | | |
|---|---|---|
| 3,632,955 | 1/1972 | Cruickshank et al. . |
| 3,634,930 | 1/1972 | Cranston ................................. 156/64 X |
| 3,731,866 | 5/1973 | Mason et al. . |
| 3,738,560 | 6/1973 | Kulicke, Jr. et al. . |
| 4,116,376 | 9/1978 | Delorme et al. . |
| 4,372,802 | 2/1983 | Harigane et al. . |
| 4,393,579 | 7/1983 | Van Hooreweder . |
| 4,526,646 | 7/1985 | Suzuki et al. . |
| 4,608,494 | 8/1986 | Kobayashi et al. .................... 29/740 X |
| 4,628,464 | 12/1986 | McConnell ............................. 29/759 X |
| 4,631,812 | 12/1986 | Young . |
| 4,675,993 | 6/1987 | Harada ..................................... 29/740 |
| 4,738,025 | 4/1988 | Arnold .................................. 29/740 X |
| 4,762,578 | 8/1988 | Burgin, Jr. et al. . |
| 4,787,143 | 11/1988 | Yagi et al. ............................. 29/740 X |
| 4,797,994 | 1/1989 | Michaud et al. . |
| 4,803,124 | 2/1989 | Kunz . |
| 4,809,430 | 3/1989 | Maruyama et al. .................... 29/739 X |
| 4,823,394 | 4/1989 | Berkin et al. . |
| 4,857,133 | 8/1989 | Mullen . |
| 4,858,554 | 8/1989 | Tsuchiya . |

(List continued on next page.)

FOREIGN PATENT DOCUMENTS

| | | |
|---|---|---|
| 0390046 | 10/1990 | European Pat. Off. ................. 29/740 |
| 2140116 | 2/1973 | Germany . |
| 58-59064 | 4/1983 | Japan . |
| 64-66998 | 3/1989 | Japan . |

OTHER PUBLICATIONS

Brochure for Swissline 9000 from Alphasem.

Primary Examiner—David A. Simmons
Assistant Examiner—M. Curtis Mayes
Attorney, Agent, or Firm—Barnes & Thornburg

[57] ABSTRACT

An aligning and positioning system for a bonder including a bond sensor for sensing the X, Y and θ coordinates of a substrate at the bonding location and a die sensor for sensing the X, Y and θ coordinates of the die on a die transport. A controller correlates the sensed coordinates from the sensors and adjusts the X, Y and θ of the die and the substrate relative to each other to place the die at a preselected bond site on the substrate. The Z coordinate of the surface of the substrate, as well as its planarity, may be sensed by a Z optical sensor. The X and Y coordinates of the substrate are adjusted and the θ coordinate of the die on the die transport is adjusted.

A pattern recognition system is used with the die and bond sensors to determine the coordinates as well as quality control of the substrate prior to bonding, the quality of paste pattern on the die or the substrate prior to bonding and the quality of the bond and the coordinates of the die after bonding. In a calibration phase, the controller correlates the X, Y and θ coordinates of the substrate transport and the bond sensor, and the X, Y and θ coordinates of the die transport with the die sensor. The magnification factor of the two sensors are also correlated.

8 Claims, 8 Drawing Sheets

U.S. PATENT DOCUMENTS

| | | | |
|---|---|---|---|
| 4,941,256 | 7/1990 | Capson et al. | 29/833 |
| 4,951,388 | 8/1990 | Eguchi et al. | 156/578 X |
| 4,959,898 | 10/1990 | Landman et al. | 29/833 X |
| 4,980,971 | 1/1991 | Bartschat et al. | 29/740 X |
| 4,987,676 | 1/1991 | Amorosi | 29/740 |
| 5,057,337 | 10/1991 | Makino et al. | |
| 5,060,366 | 10/1991 | Asai et al. | 29/739 |
| 5,084,959 | 2/1992 | Ando et al. | 29/833 |
| 5,086,556 | 2/1992 | Toi | 29/740 |
| 5,155,903 | 10/1992 | Nakashima et al. | 29/740 X |
| 5,212,881 | 5/1993 | Nishitsuka et al. | 29/740 |
| 5,249,349 | 10/1993 | Kuinose et al. | 29/740 X |
| 5,249,356 | 10/1993 | Okuda et al. | 29/759 X |
| 5,397,423 | 3/1995 | Bantz et al. | 29/739 X |

CERAMIC CARRIER TRANSPORT FOR DIE ATTACH EQUIPMENT

This is a Continuation of application Ser. No. 07/885,849, filed May 20, 1992, now abandoned.

BACKGROUND AND SUMMARY OF INVENTION

The present invention relates generally to apparatus for bonding electronic dies to a substrate and more specifically wherein the substrate is a ceramic carrier.

Inner lead bonders for bonding dies to the leads of a carrier tape can be performed with extreme accuracy since the positioning of the leads on the carrier tape is well controlled. A typical example is U.S. Pat. No. 4,526,646 to SUZUKI, ET AL. wherein the carrier tape 16 has its XY position adjusted with respect to the bond site. Die positioning fingers 43 adjust the θ and the X coordinate of the die with respect to Table 40. A die defect detection camera 81 is provided at the wafer pick up station. A die positional pattern detecting camera 83 detects positional deviation in the Y direction. A lead positional pattern detection camera 85 detects the position of the lead pattern at the bond site. The positional deviation of the lead pattern of the carrier tape 16 from the pattern of the die 51 detected by camera 83 is computed. Then, the XY table 31 is driven to adjust the tape carrier with respect to the bond head 10 in die 51 for the computed deviation.

The accuracy of the system like that in SUZUKI, ET AL. depends on the mechanical set up time to align the axis of cameras 83 and 85 to the system. Similarly, the accuracy of the alignment with respect to the moveable Tables 40 and 31 is not verified. This alignment between the camera axis and the magnification factor of the two cameras are not taken into account. Thus, the accuracy of the system is a function of the set up procedure.

A lead bonder to lead frame as in SUZUKI, ET AL. applies the die from below the lead frame. This same type of system cannot be used without modification wherein the die is to be placed on a substrate, for example a printed circuit board or a ceramic carrier. A typical example of a top mounting system is shown in U.S. Pat. No. 4,797,994 to MICHAUD, ET AL. The die is applied to a metallic substrate shown as a lead frame. An optical system is provided at the wafer for locating the die and indicating the presence of a substandard die at the pick up location. The details of the optical system is described in U.S. Pat. No. 4,823,394. The die is placed at a bond site which has received an application of epoxy or adhesive prior to being moved to the bond site location.

The quality of the bond of the electronic die to the substrate is a function of the pressure applied by the bonding or insertion tool. Some system applies a fixed pound force for a given amount of time. This does not take into account the deviation of the distance between the bond head and the surface which may result from misalignment of the bonding surface or nonplanarity of the bonding surface. One method which addresses this problem is described in U.S. Pat. No. 4,857,133 to MULLIN. Instead of applying a predetermined force by depressing the die onto the package at a predetermined separation distance, MULLIN brings the die and package into contact and records the position. Then they are separated and paste is applied to the package. Finally, the die and the package are repositioned at the predetermined position from the recorded position.

This mechanical procedure of determining the alignment of depth along the Z axis takes a considerable amount of time and it generally cannot be used in mass production. An apparatus for non-contact sensing, and controlling of spacing between a depositing tip and selected depositing location on a substrate, is described in U.S. Pat. No. 4,762,578 to BURGIN ET AL. The sensor is a laser system and the depositing tip may be a paste nozzle or a nozzle which picks up dies and places them at the bonding site.

Another problem with die bonding machines to a substrate versus a lead frame is that the pattern for the bonding paste must be developed for each unique sized die. Generally the paste is applied as a plurality of dots resembling a shower head. To improve upon this process, a starfish pattern has been used as described in U.S. Pat. No. 4,803,124 to KUNZ. Using either method, the pattern is specifically designed for the size of the die. This is not a problem on large runs, but for smaller runs through an automatic bonding machine, there is a lot of down time in developing the appropriate characteristics of the bonding paste pattern. As with the previously discussed patents, the bonding material is applied to the substrate or carrier surface generally prior to the bonding location. There is no pre-inspection of the bonding paste layer or pattern to determine whether it will produce an appropriate bond. Post-bonding inspection, if any, would not prevent wasting a die and a substrate if preinspected.

Another problem which varies the accuracy of alignment in bonding the die to a substrate is that the substrates are generally carried on boats versus lead frames which are part of the carrier. The boat is adjusted to its position at the bonding location and the substrate may shift with respect to the boat prior to the bonding process. This substantially affects the accuracy of alignment of the die to the substrate at the desired bond site.

Thus the present invention is directed to a bonding system which minimizes the set-up time while maximizes the accuracy of alignment.

Another object of the present invention is to provide a bonding system wherein the alignment of the various elements of the system are determined in a set-up stage and mathematically correlated to reduce the set-up time.

Still another object of the present invention is to provide a bonding system which monitors and compensates for X, Y, Z and θ during bonding.

Still an even further object of the present invention is to provide a bonding system which monitors the quality of the bonding paste pattern prior to bonding.

An even further object of the present invention is to provide a bonding system wherein the monitoring and correction of the orientation of the die to the substrate is performed after paste is applied to the die.

Still an even further object of the present invention is to provide a bonding system where not only the height of the bonding surface with respect to a reference is determined, but also the planarity of the bonding surface.

Still an even further object of the present invention is to provide a bonding system which has inspection of the bonding surface prior to bonding and of the bond after bonding.

Still an even further object of the present invention is to provide a bonding system which includes inspection of the die at the wafer before being picked up and inspection of the substrate prior to bonding so as to maximize acceptable bonded product.

Still an even further object of the present invention is to provide a bonding system wherein the position of the bond site prior to bonding is verified even after initial adjustments.

These and other objects are attained by an aligning and positioning system for a bonder including a first or bond sensor for sensing the X, Y and θ coordinates of a substrate at the bonding location and a second or die sensor for sensing the X, Y and θ coordinates of the die on a die or second transport which transports the die from a supply location to the bond site on the substrate. A controller correlates the sensed coordinates from the first and second sensors and adjusts the X, Y and θ of the die and the substrate relative to each other to place the die at a preselected bond site on the substrate. The system mathematically compensates for any misalignment. The Z coordinate of the surface of the substrate, as well as its planarity, before bonding and the Z coordinate and planarity of the die after bonding may be sensed by a third optical sensor. The first and second sensors may be optical sensors. The X and Y coordinates of the substrate are adjusted and the θ coordinate of the die on the die transport is adjusted. The X, Y and θ of the die after bonding is the also measured.

A pattern recognition system is used in the first and second sensors to determine the coordinates as well as quality control. First sensor can monitor the quality of the substrate prior to bonding. This will include the planarity as well as the conductive or paste pattern if any on the substrate. The first sensor may also monitor the quality of the bond after bonding. The second sensor, which will monitor the quality of the layer of bonding paste on the die, if applied prior to bonding.

In a calibration phase, the controller correlates the X, Y and θ coordinates of the substrate or first transport and the first sensor. It also correlates the X, Y and θ coordinates of the die transport, which carries the die to the bond site, with the second sensor. The magnification factor of the two sensors, which are generally cameras, are also correlated. This mathematically compensates this system for all factors involved such that there is an active correlation of the sensed coordinates of the die and the substrate by the sensor and positioning system. The position of the die on the die transport is determined after pasting and before bonding. The desired bond site is also verified after the X, Y adjustments of the substrate and the θ adjustment of the die to assure there has not been any further misalignment prior to bonding. If need, another X, Y and θ adjustment is performed.

The method of calibration includes determining and recording the X, Y and θ offset between the first and second sensors, and also determining and recording the θ offset between the first sensor and the first transport of the substrate. The center-line of the first sensor and of the substrate transport at the bonding station are aligned. Similarly, the center-line of the second transport for the die and the first transport for the substrate are aligned to the bonding location. The center of rotation of the die transport in the coordinate system of the second sensor is determined and recorded.

The first and second sensors are cameras and their magnification factor is determined and recorded. The magnification factor is determined by selecting a pair of reference points a known distance apart for the first sensor and the second sensor and determining the distance between the pair of reference points in the field of view of the camera. These reference points may be at two corners of a reference object.

The θ offset between the first sensor and the first transport is determined by selecting a reference point on the first transport, activating the first transport to move the reference point in the X and Y direction of the first transport, and determine the change of the position of the reference point in coordinate system of the first sensor. Similarly, the reference point may be one or more of the corners of a referenced object.

The θ offset between the die transport and the substrate transport is determined by positioning a reference object on the substrate transport at the bonding location and determining the θ orientation of the reference object in the coordinate system of the first sensor. Next, activating the die transport to pick up the reference object and to move the reference object to the second sensor and determine the θ orientation of the reference object in the coordinate system of the second sensor. Determining the θ orientation of the reference object in either of the sensors is performed by determining the position of at least three of the four corners of the reference object. The center of rotation of the second or die transport in the coordinate system of the second sensor is determined by rotating the die transport through a predetermined angle at the second sensor.

The general method of bonding includes determining the position of the die with respect to a bonding head or die transport, determining the position of a substrate at a bonding location, rotating the bonding head to position the die in the desired θ alignment with the substrate, positioning the substrate in X and Y coordinates to position a desired bond site at the bonding location, moving the bonding head with the die to the bonding location, and bonding the die to the bond site. Additionally, the position of the bonding site at the bonding location is determined after position of substrate and before moving the bonding head to assure alignment.

Other objects, advantages and novel features of the present invention will become apparent from the following detailed description of the invention when considered in conjunction with the accompanying drawings.

BEST MODES FOR CARRYING OUT THE INVENTION

Figure 1:
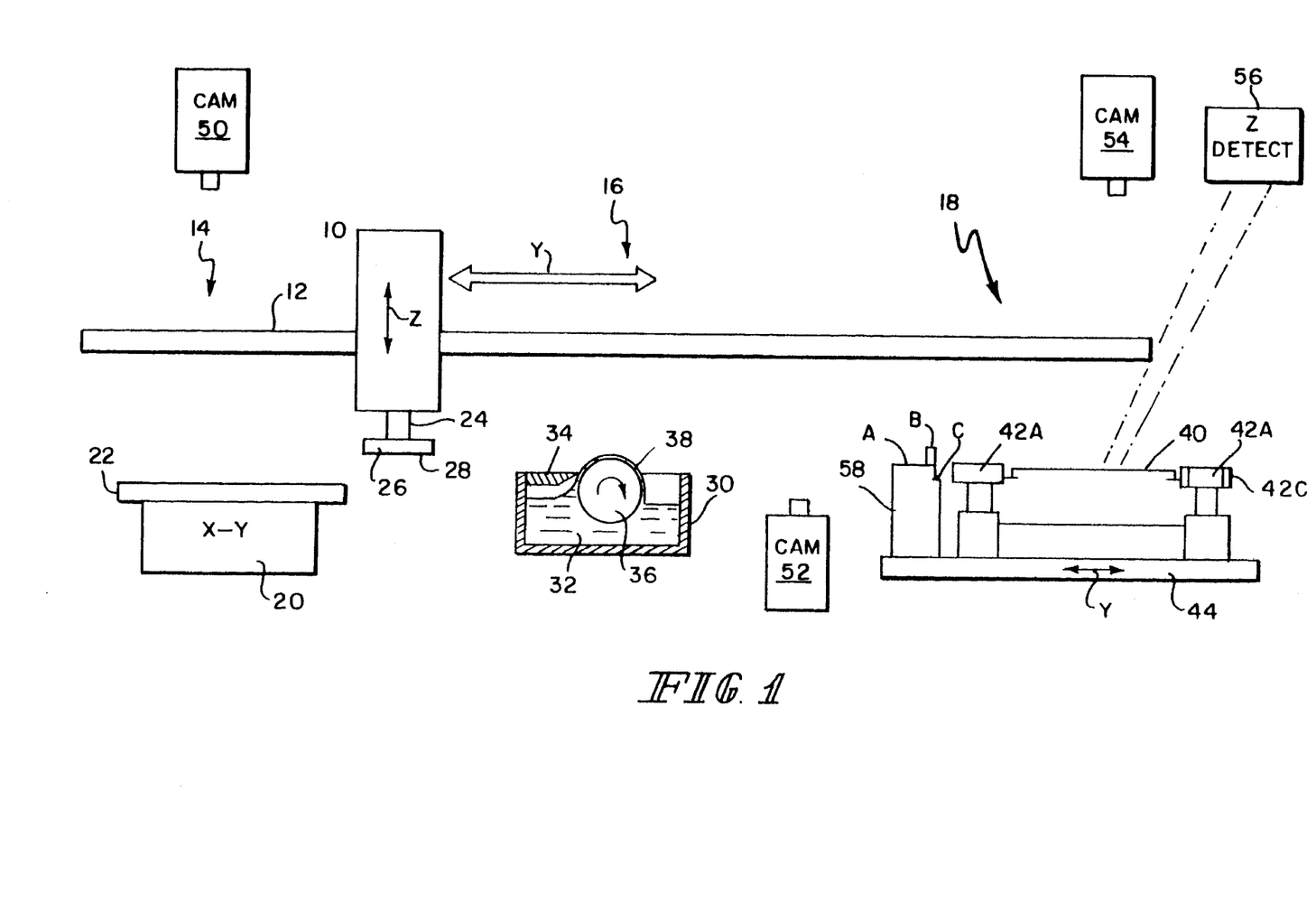
FIG. 1 is a schematic side view of a bonding system including a die paste station which incorporates the principle of the present invention.
Figure 2:
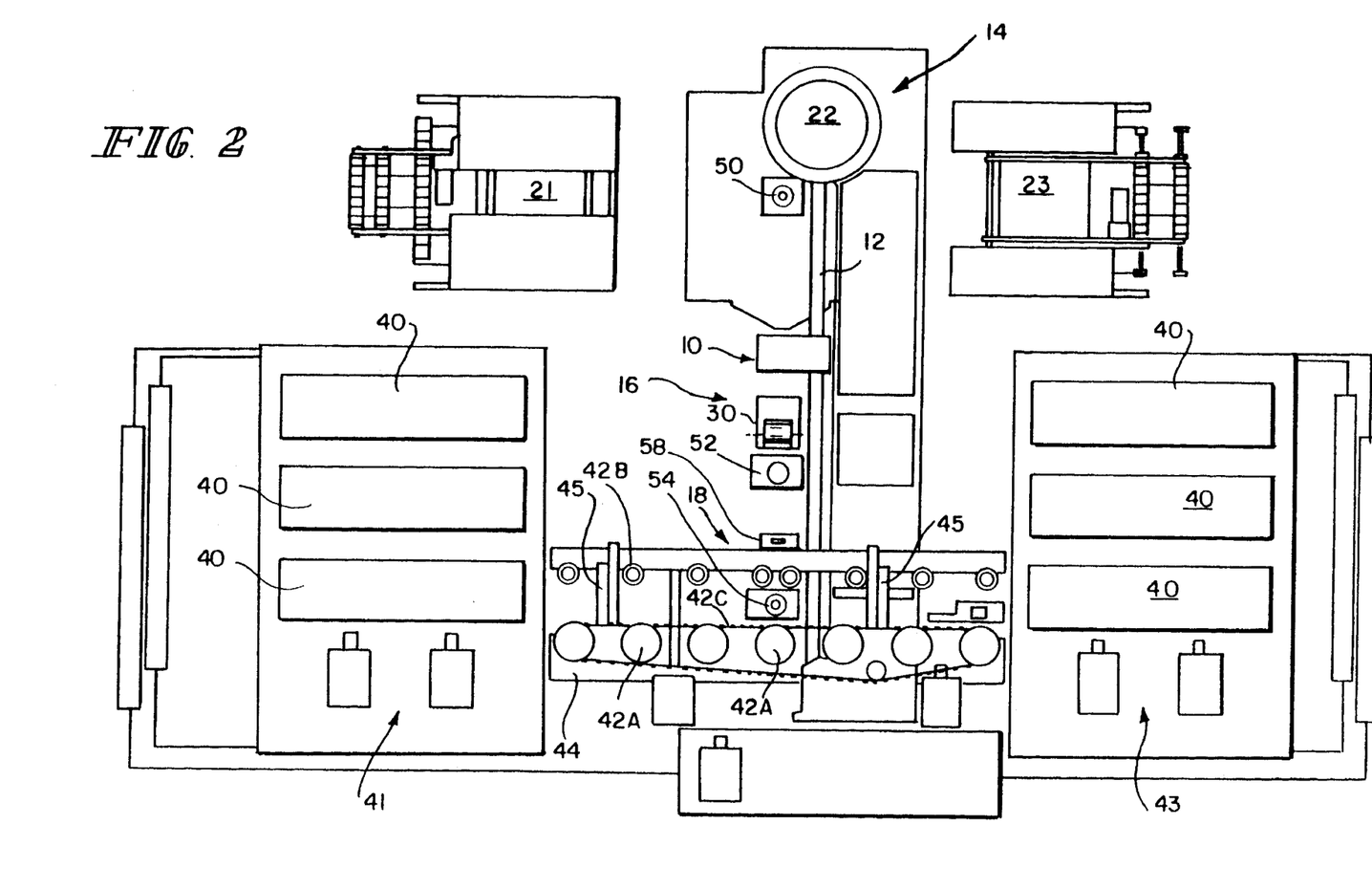
FIG. 2 is a plane view of a bonding system incorporating the principles of the present invention.

A bonding system as illustrated in FIGS. 1 and 2 includes a die transport 10, including a bonding head, riding on rail 12 between a wafer or pickup station 14 through a paste station 16 to a bonding station 18 where a die is bonded to a substrate. The wafer station 14 includes an X–Y table 20 to position the wafer 22 which includes a plurality of dies. Full wafers are stored at position 21 and empty wafers are stored at position 23. The die transport 10 include a bond head 24 which extends down to and picks up die 26 which has been positioned by the X–Y Table 20. The bond head 24 is then raised and moved in the Y direction toward the bonding station 18. A die 26 is shown as being retained by the bond head 24 and having a bottom surface 28. During transport, paste is applied to the surface 28 of die 26.

The paste station 16 includes a reservoir 30 having paste 32 therein. A roller 36 has surface which rotates into and out of the reservoir and relative to a doctor blade plate 34 to form a layer 38 of bonding paste on the exterior of the roller 36. As the transport 10 moves continuously through the paste station 16, the surface 28 of the die 26 comes into contact with the layer 38 of paste to transfer a layer of paste onto a surface 28 of die 26 as it travels to the bonding station 18. Alternatively, the paste may be applied to the bond site on a substrate prior to or at the bonding station 18.

The bonding station 18 includes a substrate or a boat 40, which carries a substrate, moved in the X direction by a substrate transport 42 from a magazine 41 and to storage 43. The transport 42 includes a set of rollers 42A having a conveyor belt 42C which engages one side of the sides of the substrate or boat 40 and a set of rollers which engage the other side of the substrate 40. The rollers 42A and 42B are adjustable in the Y axis by element 45 to accommodate various width substrates or boats. A table 44 moves the rollers 42A and 42B along the Y axis to position the substrate 40 along the Y axis.

Once the die transport 10 has come to rest at a preselected position at the bonding station 18, the bond head 24 is lowered to position the die 26 with the bonding material on surface 28 on a bond site on the substrate. The appropriate pressure and time of application produces acceptable bonding.

The systems required to operate the transport system for the wafer, the die transport 10, and the substrate transport 42 are well known as is exemplified by the patents previously discussed as well as being available in die bonder model number 5406 from Assembly Technologies of Horsham, Pa. Modification of this system provides for the changing of the width of the rollers 42.

The alignment and quality control system includes four sensors. A first or wafer camera 50 is at the wafer station 14 to detect the quality of the dies at the wafer as well as to position the appropriate die on the wafer 22 relative to the bond head 24. A second or die camera 52 is provided between the wafer station 14 and the bonding station 18, and preferably after the paste station 16. The die camera 52 determines the position of the die 26 on the die transport 10 or bond head 24 as well as the quality of the paste layer provided by paste station 16. A third or bond camera 54 is provided at the bonding station 18 to determine the location and the quality of the bond sites at the bonding station prior to bonding and the position of the die and quality of the bond after bonding. A detector 56 is provided to determine the Z position of the bond site and may also be used to determine the planarity of the bond site prior to bonding and the die position and planarity or tilt after bonding. A Z position reference block 58 is provided on the table 44 adjacent to the bond site 18 to be used to calibrate the Z reference for the transport 10 and bond head 24 as well as to determine the thickness of a wafer 26 as will be discussed more fully below. The control system, including a computer, includes pattern recognition for position as well as quality control.

A cycle of operation of the bonding system begins with the X–Y table 20 orientation the wafer 22 so that a die is located at the pick up site. The system using camera 50 checks the quality of die. Bad dies are passed over and the X–Y table 20 continues to orient die until a good die is in the pick-up position. The wafer inspection determines defective dies which include ink dotted dies, target test dies, bare silicon die, edge dies, corner dies, and metalization dies. Through pattern recognition, the system can also detect large scratches and open cracks in a die. Camera 50 is also used for positioning dies at the pickup site. While the wafer is being oriented, the Boat Load/Unload Stations 41, 43 cycle until a boat or substrate is injected into the Boat Transport 42.

When a good die is available for pickup, the die transport 10 moves back to a set Y pickup position. Vacuum is applied to the bond head 24. The plunge up program starts to strip the die from its tape backing on the wafer 22. The bond head 24 is lowered and in concert with the two stage plunge-up picks the die 26 from the wafer 22.

Meanwhile, the boat transport 42 has moved the boat 40 to a bond position 18 and scanned it with detector 56 to see if a ceramic package or substrate is present. If no package is present, the boat is indexed by 42C and scanned until a package is detected. The package depth is also recorded as the package is scanned. The depth must be within programmed limits for the package to be deemed good.

The detector 56 may be a laser and may also determine the planarity of the bonding surface of the package by multiple depth measurements as well as its depth or Z coordinate. The system using camera 54 checks the quality of the bond site. This can include the paste pattern if the paste pattern is applied to the substrate as well as the conductive pattern or lead frames on the substrate. The boat transport 42 will index the boat until an acceptable bond site is provided. The system with camera 54 also determines the X, Y and θ coordinates of the bond sites at the bonding station 18.

Once the bond head 24 has the die 26, it passes the die 26 across the paste station 16 to deposit a coating of paste on the bottom 28 of the die 26. The die 26 is moved over camera 52 to determine how the die 26 is aligned to the center of the bond head 24 or the X, Y and θ coordinates. The pattern recognition system will also determine the quality of the paste pattern on the surface 28 of die 26. The control system determines and rotates the bond head 24 to correct for θ and moves the cavity so as to be accurately positioned at the bond site. The cavity is moved in X by the boat drive 42 and in Y by the Y table drive 44. The next move of the bond head 24 is to a fixed Y position under the bond camera 54.

The control system recalls the value of the depth of the cavity that is recorded when the cavity was scanned by sensor 56, subtracts the die thickness and bondline thickness programmed in during setup, calculate the proper number of steps to lower the bond head 24, then lowers the head this amount. While the bond head 24 is being lowered, a load cell (not shown) is being monitored to insure that excess force is not placed on the die. Once the proper height is obtained, the vacuum is released, a programmed air blow-off and dwell are completed and the bond head 24 retracted. After die placement, the bond camera 54 determines the quality of the die bond and its X, Y and θ and the detecter 56 determines the Z and planarity or tilt of the bonded die and accept or reject it. While the bonding was proceeding, the wafer system 20 has positioned the next good die, ready for pick-up.

This is the basic cycle of the bonding system that is repeated. The independent station, working together under the control of a central processor and performing operations in parallel, results in a flexible system that is easy to operate, easy to set up, easy to troubleshoot and yet highly accurate and fast.

If the thickness of the die is to be determined prior to bonding, the bond head 24 positions the die 26 on surface A of the Z reference block 58. The sensed or measured Z value of the bond head 24 as sensed or measured by a sensor in the die transport 10 is the thickness of the die. This measurement must be made before paste application on to the die. If paste is applied to the substrate and not the die, the measurement is made before bonding. Alternatively, the detecter 56 can be used to measure die thickness. The die is positioned on surface A of reference block 58 which is positioned under detector 56. Measurement of the Z value of the top of the die is made. This is the die thickness. This measurement must be made between substrate carriers.

Figure 3:
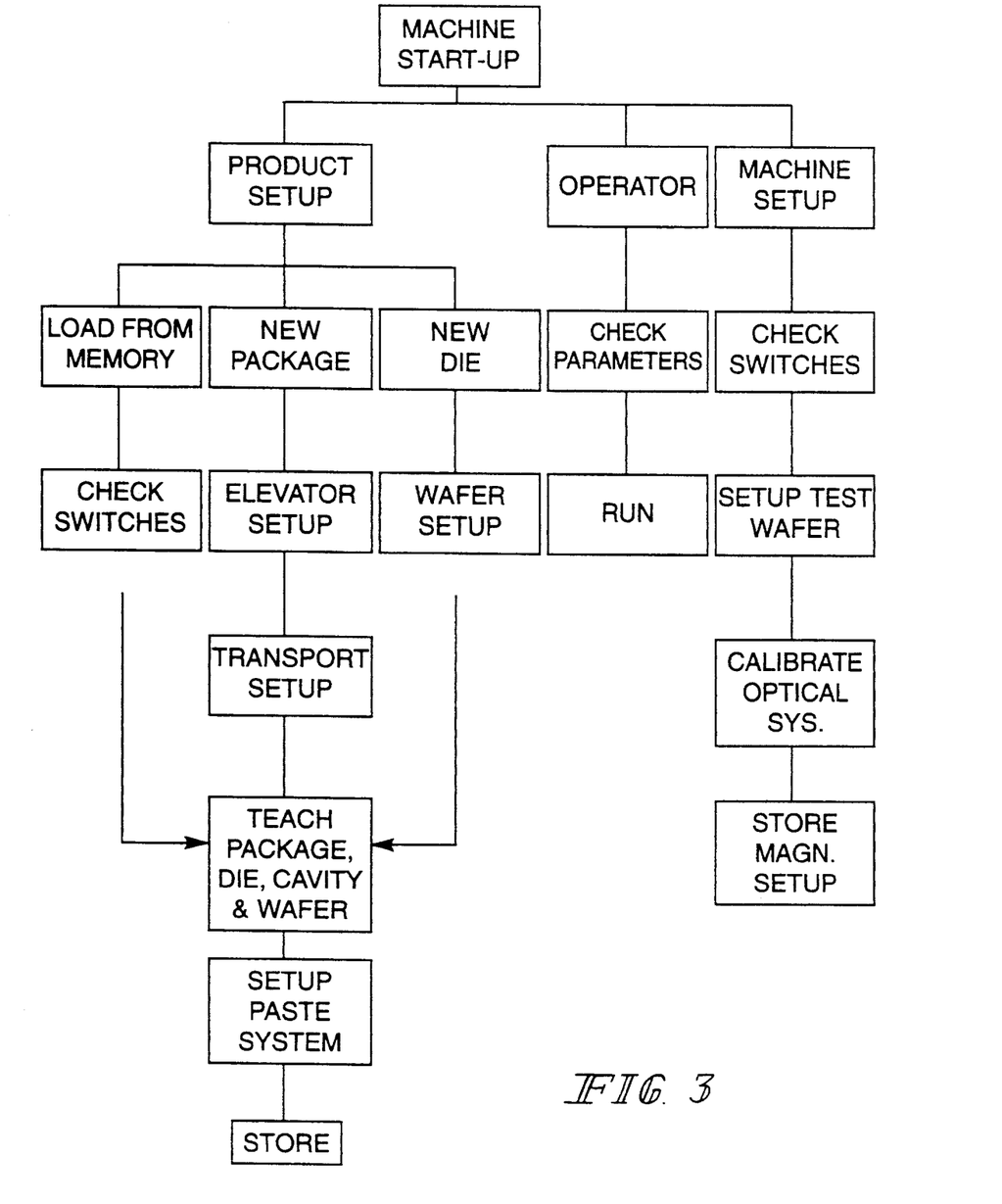
FIG. 3 is a flow chart of the modes of operation of the bonding system according to the principles of the present invention.

FIG. 3 shows a flow chart of the operational modes. These modes are "Product Setup", this is where a new product is being bonded for the first time on the bonding system; "Operator", the standard production running of the bonding system; and "Machine Setup", this mode is only used when the bonding system is first placed into service or if some part of the transport or optical system has been changed. In all cases, the first operation is to turn on the machine.

The machine setup mode allows the operator to see that the proper subsystems or systems are turned on for the particular mode of operation. This is performed by checking the switches which enables or disable appropriate systems and subsystems. For example, the Die Recognition System or any other of the optical criteria or quality controls may be selectively disabled. Similarly, portions of the alignment system may be selectively enabled or disabled.

The next step in machine setup mode is to provide the parameters for the wafer control system. This must be performed every time a new die size is to be run. This includes setting the parameters for the needle and vacuum system, adjusting the optical system including camera 50, and the XY table 20, including the θ, using a test wafer.

The next step is the calibration of the optical control systems. The present system eliminates the need to set or adjust sensors when changing from one setup to another as well as need for extreme close tolerances, both of which require many hours of highly trained service personnel to align the system. The present bonding system eliminates these constraints by performing the alignment mathematically rather than mechanically. The calibration of present bonding system can be calculated and recalculated by an operator with a minimum of training of less than five minutes.

If the bond head 24 or the detector 56 is serviced, the calibration of the bond head Z axis and the detector 56 must be reset. This bond head Z axis calibration program should be run any time a tool is replaced on the bond head 24.

The bond head Z axis calibration includes positioning the calibration block 58 within the field of view of the Z detector 56 by table 44. The height of surface A of the calibration block 58 is measured by the Z laser detector 56 and is stored in the program. Transport 10 moves bonding head 24 over and is lowered down to touch the calibration block 58. The system measures the Z value of the bond head 24 in engagement with surface A of the block 58. This Z value for the bond head 24 is the calibration or reference value to be used in the position control system. This Z value is compared with the value from Z detector 56 to provide a mathematical correlation between the optical measured value from Z detector 56 and the physically controllable value of the bond head 24. The detecter 56 is calibrated by measuring the surface A, B and C of the reference block 58 wherein they represent 0, +50 milimeters and −50 milimeters, respectively. The computer makes the necessary calibration of the detector readings.

Camera calibration should only be required if either the die camera 52 or bond camera 54 has been disturbed, or the die inspection or bond positions of the bond head 24 have been disturbed. Camera calibration mathematically aligns the die camera 52 to bond head die inspection position, the bond position of the bond head 24 and the bond head camera's 54 axis to the substrate transport's 42 axis. This eliminates any reason to fine adjust or shim either camera to a fixed position.

Figure 4:
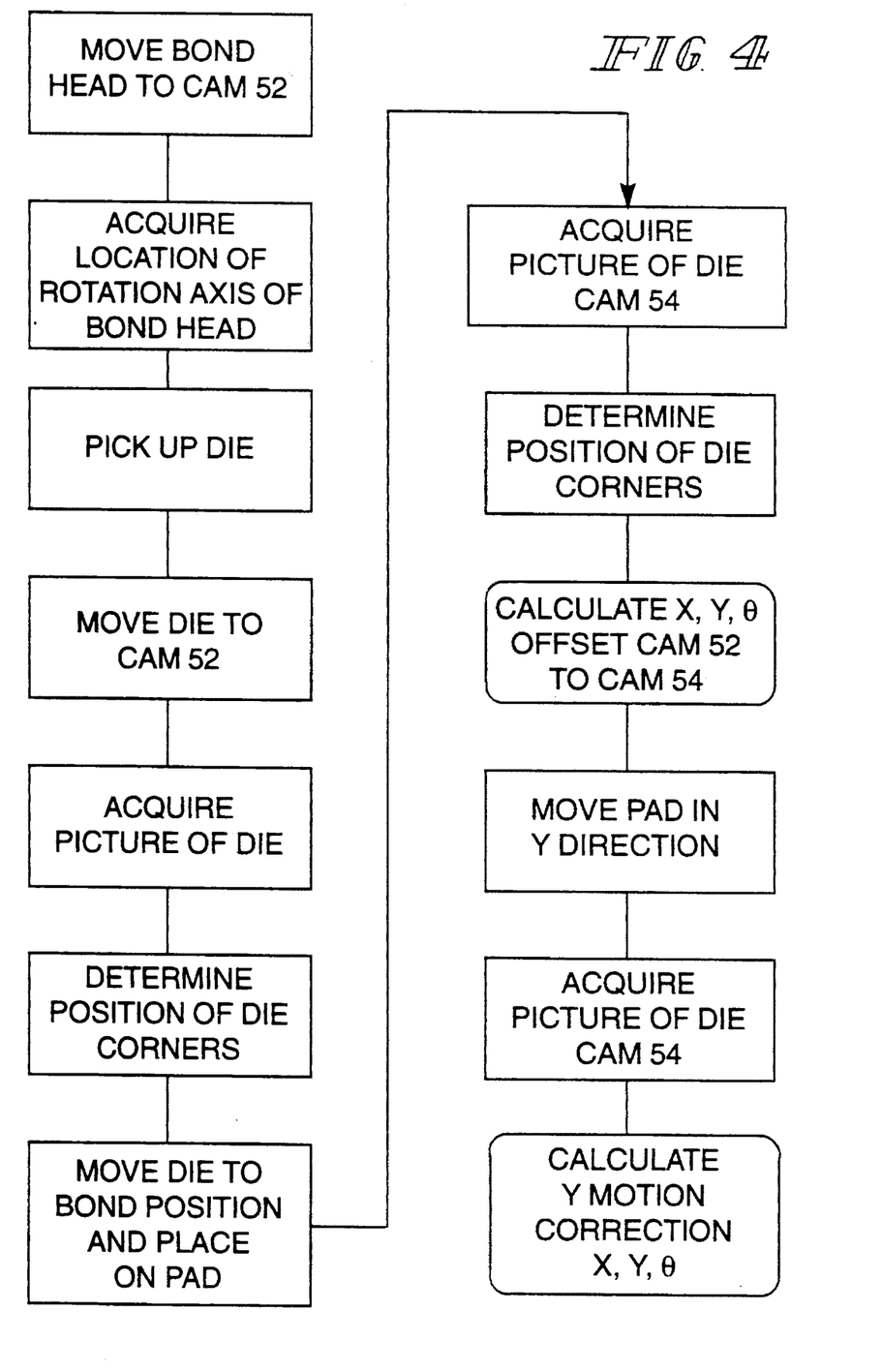
FIG. 4 is a flow chart of the camera calibration sequence incorporating the principles of the present invention.

The sequence as described in FIG. 4 begins by moving the bond head 24 to the die camera 52. The camera 52 is manually adjusted in the X direction to be along the Y path of the die head 24 and the bond head 24 is adjusted in the Y direction so as to center the field of view of camera 52 on the center of the pickup head 24. This accomplished visually by a crosshair in the camera 52 on the center point of the pickup head 24. This results in acquiring the location of the rotation axis of the bond head in the coordinate system of the die camera 52.

The rotation axis of the bond head 24 is also adjusted with respect to the center line of camera 3 at the bonding position. The bond head 24 is adjusted in the Y direction, and the camera 54 in the X and Y position such that the bond head 24 and the camera 54 center lines coincide. This is again achieved by aligning a crosshair in the center of the camera with the center line of the bond head 24.

Next the bond head 24 will pick up a die either at the wafer station or a die can be manually applied to the bond head. Transport 10 is controlled to move the bond head 24 over the die camera 52 at the die camera inspection position. A picture of the die is acquired. A display of the picture of the die allows the operator to adjust the lighting to obtain a well defined image with sharp edges.

In order to determine and interrelate the X, Y and θ coordinates of the die camera 52 to the bond camera 54, the X, Y and θ coordinates of the die at die camera 52 must be determined. This determination is made in the present system by determining the position of the die corners. This is carried out by electrically moving crosshairs to each of the four corners of the die. The magnification factor or the pixel-to-mill ratio of die camera 52 is determined by comparing the known measurement between two corners of the die with the optical distance between two corners in the field of view of die camera 52. Since the position, focus and F stop for the camera lens can affect the pixel-to-mill ratio, they should not be adjusted after the calibration cycle. Alternatively, the system can search for the corners itself. If no corners are found, the lighting is adjusted until a valid search is completed.

To verify the location of the center of rotation of bond head 24 with respect to the center axis of the coordinate system of the die camera 52, the die is rotated a predetermined number of degrees or θ and one or all of the four corners are again located within the field of view of the die camera 52. By knowing the coordinates of any point prior to and subsequent to the rotation, in the coordinate system of the camera, the center of rotation of the bond head 24 can be measured.

The transport 10 then moves the bond head 24 and die 26 to the bonding location and places die on a pad provided on the X, Y substrate transport system 42, 44. The bond head 24 is then moved back to allow the bonding camera 54 to make its measurements. A picture of the die 26 is acquired by camera 54. As with the die camera 52, the picture is displayed and the operator can adjust the lighting to produce a well defined image of the die with sharp corners and edges.

As with the die camera 52, the bond camera 54 determines the X, Y and θ of the die with respect to the coordinate system of camera 54, the pixel-to-mill ratio or magnification factor of camera 54 and the θ of camera 54 to the X, Y substrate transport 42, 44. The X, Y and θ of the die with respect to the coordinate system of camera 54 is determined by determining the position of the four corners of the die as previously discussed for die camera 52. Knowing the actual distance between two of the corners, the system can calibrate the magnification factor or the pixel-to-mill ratio of camera 54 from the value in the field of view of camera 54. The system also calculates the X, Y and θ offset between die camera 52 and bond camera 54 by the coordinates of the four corners in the field of view of each of the cameras.

The θ of the substrate camera 54 with respect to the substrate transport 42, 44 is determined by moving the die using the Y table 44 a known distance. A picture of the die 54 is acquired and one of the reference points, namely one of the corners, is located. From the difference of position of this corner, prior to and subsequent to the Y motion, X, Y and θ corrections of the transport system 42, 44 are calculated with respect to the substrate camera 54. This concludes the calibration of the optical system with the values of calculated offsets being stored.

In the product setup, a new die and wafer setup is conducted. The parameters of the die are inputted into the computer. The wafer setup includes setting the parameters for the needle and vacuum system and the dimensions of the wafer. The sequence concludes with teaching the optical system desired parameters of the wafer which will be discussed in detail below.

For a new package, details of the package as well as controls of the elevator and the boat or substrate transport must be conducted. The boat size must be inputted. This requires adjustment of the elevators in the magazines 41 and 43, as well as the distance of separation between rollers 42A and 42B. The index parameters which must be set for the indexing in the X direction include input kicker, index to the first cavity, cavity-to-cavity index, and the number of parts on a boat. The input kicker stroke pushes the boat out of the magazine 41 and positions it so that the first hole on the side of the boat is approximately aligned with the first bump on the indexing belt 42C.

The index to first cavity is adjusted so as to stop short, in the range of at least 0.015 inches, and preferably no greater than 0.05 inches, short of the bond site. This assures that the adjustment of the boat to position the first cavity at the bond site, will always be in a forward X direction. Similarly, the cavity-to-cavity or package-to-package index is selected such that the indexing is always in the forward direction. Again, the index should be selected to be slightly less, approximately 0.015 to 0.050 inches in the distances between packages. The optic system is used to set the index to first cavity and package-to-package index.

By sensing the number of packages in the boat, the system will request the next boat from the magazine or input elevator 41 after these number of packages have been indexed. Also, a portion of the elevator and transport setup is resetting the indexers. To insure that the indexing system is always positioned correctly with respect to the elevators and the bond head 24, and the elevators are positioned correctly with respect to the indexer and the magazine slots, all positions are referenced from electronic zero position indicators. Internal registers of the control systems continuously monitors the position of the axis in motor steps from zero. In order to insure that the registers are at zero when the motions are at zero, in response to a reset, the control system will cycle each of its indexers and elevator motors until the control sees the zero position sensor. At this point, the motion is stopped and the corresponding register is set to zero. This ends the setup routine for a new package.

Another set of processes perform in the product setup includes loading from memory prestored parameters with respect to the system and checking of the switches which control the activation or deactivation of the system's and subsystem's previously described during the machine setup mode.

The ability of the control system to place die within extremely close and consistent limits lies in its ability to recognize patterns or features of the package and the die. The optical system can, under proper lighting conditions, determine the package cavity and die corners, their edges or distinct features. Die which are consistently placed within 0.001" of the wire bond pad will result in a significant reduction in the wirebond search and therefore result in increased production through-put.

For teaching the die, the die camera 52 looks at the bottom of the die after paste has been applied. Since the coating of paste would hide any pattern, the edge or corner search method is preferred to determine the location and rotation of the die 26 on the bond head 24. A feature teach for the die has been provided for future use should it become necessary. Teach the feature of a die is the same as that covered under Cavity Teach.

The choice of whether to search for die corners or die edges depends upon the die size shape and paste parameters. The proper illumination is also a major consideration. Hills of paste could look like edges if the lighting throws shadows. Other paste patterns could look confusingly like corners. Within proper control of the lighting, proper choice of edge or corner search and the search limiting features of the control system, significant improvement in the ability to locate the pasted die have been achieved.

The only parameter needed for the die teach initially is the Y dimension of the die. Once the appropriate search parameter, be it feature, edge or corner, is determined, a die search routine is conducted. The die is picked up and moved to its position over die camera 52. A display of the search for the appropriate parameter, be it a feature, edge or corner, is displayed. If the search is not successful, the lighting or the parameter searched for must be changed.

The system can locate the cavity of the ceramic package by determining the location of its corners, edges or a pair of specific features of the package. The only requirement is that the lighting be of sufficient quality and quantity to generate a high contrast of the corner, edge or feature for which it is searching. Normally the die will be positioned in X and Y to the number one bond pad on the ceramic and in θ to the row of bond pads. Since the system can find the number one pad and any other pad, the placement of the die will be independent of any tolerance of the ceramic, the boat or the position of the ceramic within the location tabs of the boat.

Cavity corner and edge detection are provided for the ceramic that has a lose lead frame. In these cases the die is located to the cavity, since the lead frame will float around when the silver-glass is fired. Edge and corner detection require close attention to lighting to insure that there is sufficient contrast between the top surface of the ceramic and the bottom surface of the cavity to insure proper detection. To help determine the proper lighting, a pseudo-color display can be generated. This display represents different levels of grey as different colors. Grey scale changes are much easier to recognize when displayed as colors.

The teach cavity begins by activating the bond camera 54 and then inputting the package dimensions. As with the die teach, the parameter to be searched (namely feature, edge, or corner) is selected. If either the edge or the corner was selected, the system generates its own model of the edge or corner. If a feature is the selection, a feature must be taught. This begins with the system capturing the image displayed by the bond camera 54 and placing it in memory. Storage image is displayed to allow manipulation on the screen by changing size and position of the display. This will allow the operator to hone in and teach the system the particular feature to be used in the search. A first and second feature should be taught to allow determination of the rotation of the ceramic with respect to the X axis as previously discussed. Once both models have been created, a crosshair is used to be aligned with the cavity corners. This information is used to correct any rotation of the original ceramic to the X axis of the transport.

Figure 5:
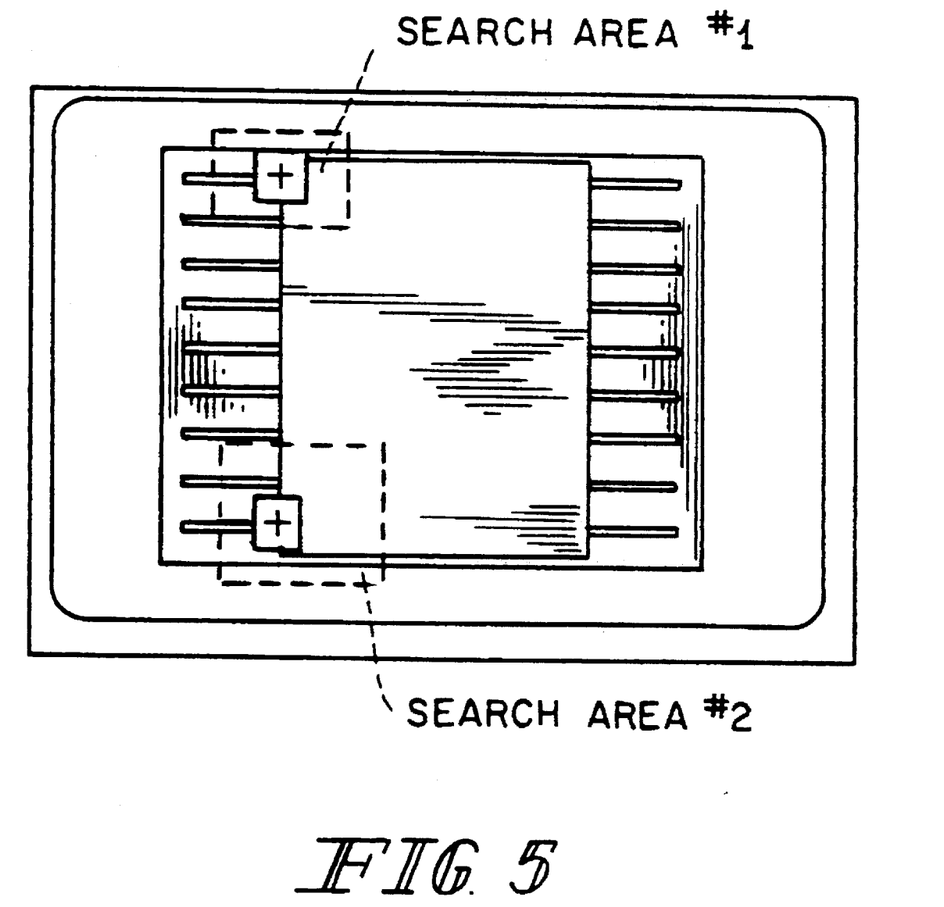
FIG. 5 is a display of package search during package teach.

To check the search parameters and lighting, the search feature of the system is activated. The results are displayed showing a captured picture of the package with two boxes representing the models that the system had found as illustrated in FIG. 5.

If these are the corners or edges, depending on the previously selected search parameters, then the search has been successful. Sometimes the system will find something else or nothing. In these cases, either the lighting or the parameter searched for must be changed. The system will also display boxes representing the search area. If these boxes are large, then the lighting may require attention to insure better model recognition.

Once the die and package have been taught, the relationship of the die to the package must be taught. The position of the die in the X and Y direction as well as its degree of rotation may be entered numerically or taught by moving a cursor on a display screen with respect to an image of the cavity. If the search parameter mode selected was cavity corners or edge selection, numerical entry is preferred. Where a feature has been selected, teaching the location by moving a cursor within the display of the cavity is preferred.

A pattern recognition system is used to teach the views for quality control. In the wafer inspection in addition to identify the ink spots which identifies a defective tested die, the other feature described above, for acceptable and unacceptable die patterns, are stored. Appropriate paste layers are also stored using the optical system, whether the paste is to be monitored by the camera 52 at the bottom of the die when paste station 16 is used, or whether the paste is applied to the substrate and monitored by camera 54 at the bond site. The quality control of the substrate can also be monitored, including detecting the lead patterns and missing leads. This is also taught using pattern recognition. And finally, a post-bond inspection is determined by pattern recognition. Many pattern recognition systems are known and generally include appropriate software. The present system has successfully used Cognex 3100 and 3400 processor and software from Cognex Corporation, Needham, Mass.

Although not part of the pattern recognition system, post-bond inspection will also include measuring the X, Y and $\theta$ position by a picture acquired by bond camera 54 and the Z position, bondline height and die tilt or planarity using detector 56. The X an Y position of the bond die is adjusted to make the multiple Z readings necessary to make these measurements.

As will be noted, most of the product setup parameters for the boat, cavity, wafer and die are computer entered. The search parameter selection and verification is computer operated. This allows a minimum amount of time for change over for each new package and die.

Figure 6:
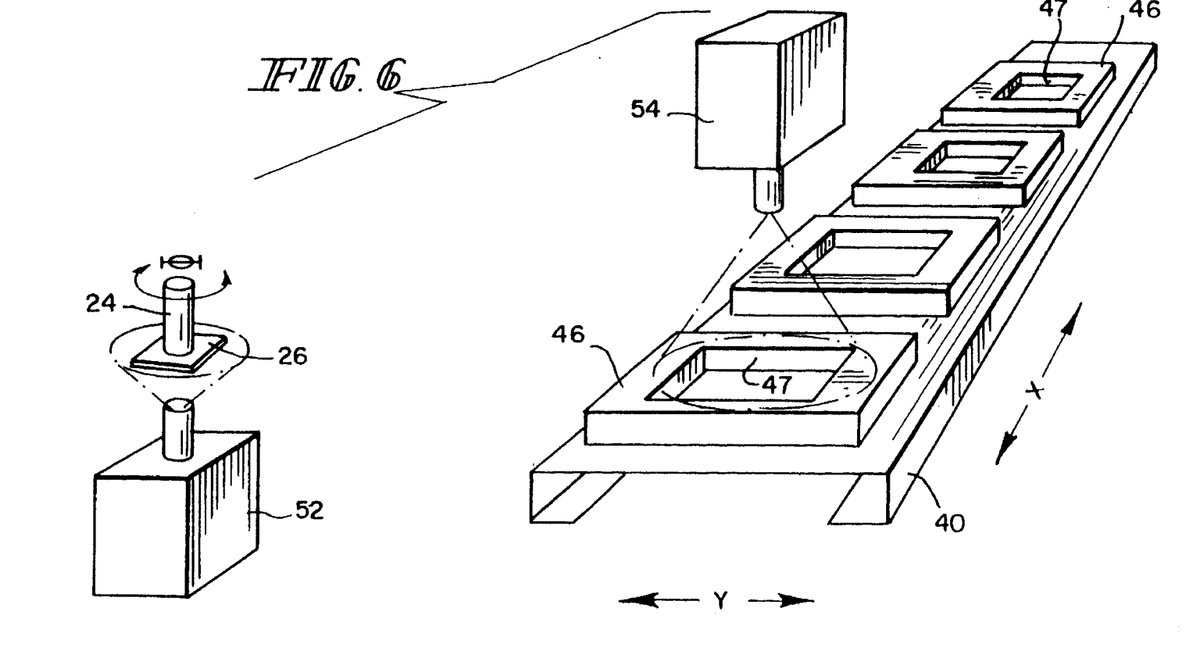
FIG. 6 is a perspective representation of the alignment method according to the present invention.

A flow chart for the operation of the alignment system of FIG. 9 will be explained with respect to the schematic view of the die camera 52 and the bond camera 54 as illustrated in FIG. 6 and their respective views illustrated in FIG. 7 and 8. As illustrated in FIG. 6, the boat 40 includes a plurality of packages 46 each including a cavity 47. The depth detector 56 has been deleted from the view of FIG. 6 for sake of clarity as well as the Z reference or calibration block 58.

A die is picked up at the wafer station 14 by the bond head 24. During this step of transporting the bond head 24, the cavity 47 of the package 46 is indexed to the bond site under camera 54. Next, there is a determination of whether paste will be applied to the die at the paste station 16 or whether a shower head paste configuration will be applied to the cavity 47. If it is to be applied by a drum roll at paste station 16, the paste routine is executed. Upon completion of the die paste routine or if the die is not to have paste applied to it, the die is moved to the die camera 52. Simultaneously with this or subsequent thereto, the picture of the cavity is acquired by bond camera 54 resulting in the view of FIG. 8. The parameter location is determined, namely corner edge or a taught feature.

Figure 7:
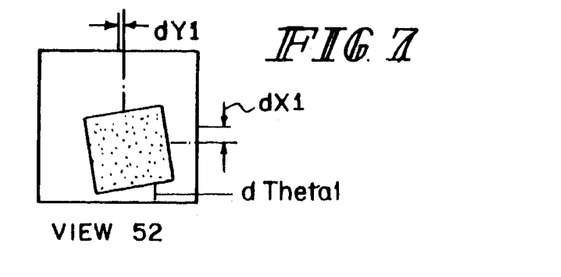
FIG. 7 is a sample field of view of the die camera of FIG. 6.
Figure 8:
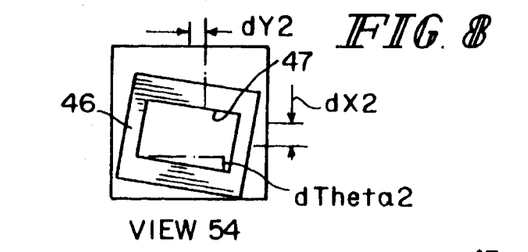
FIG. 8 is a sample field of view of the bond camera of FIG. 6.

Next there is a determination of whether paste is going to be applied directly to substrate by shower head. If the answer is yes, the movement of the cavity 47 to the paste position as calculated and converted to the required number of pulses for the X positioning index motor. These number of pulses are sent to the controller which moves the transport 42 to position the cavity under the shower head and paste is applied. The bond camera 54 acquires a picture of the paste pattern on the bond site where it is checked by the character recognition system to determine its quality. The view acquired as illustrated in FIG. 8 by bond camera 54 is also used to determine the location of the search parameter selected after the pasting operation. In the final determination step of either paste sequence, the image acquired by camera 54 produces a $\Delta Y2$, a $\Delta X2$, and a $\Delta \theta 2$ of the cavity with respect to the field of view of substrate camera 54. This assures that any movement resulting from positioning or pasting using the shower head will not affect the ultimate positioning alignment for the bonding sequence.

Where the shower head was used or the paste is applied to the die, the sequence continues with acquiring image of the die on camera 52 as shown in FIG. 7. The system determines the corner or parameter location and edge angle. This is used to determine the die's position with respect to the bond head 24 and the quality of the paste on the die. This results in $\Delta Y1$, $\Delta X1$, and $\Delta \theta 1$. Knowing the variations of the die with respect to the bond head 24 within the field of view of camera 52 and the deviation of the cavity or parameter of the cavity from the view of view of camera 54, the system calculates the required die $\theta$ rotation and cavity X, Y translation needed to align the die on the bond head 24 with respect to the bond location in the cavity 47 in the field of view of camera 54. These rotations and translation are converted to the required number of pulses to drive the motor and sent to the controller. The controller then moves the cavity using the Y table 44 and the X transport 42 to position the cavity with respect to camera 54 and to rotate the bond head 24 to position the die 26 at the appropriate θ position.

After the cavity is moved and the die is rotated, the bond camera 54 reacquires the picture of the cavity to determine the exact final location of the cavity and make any necessary adjustments of the position of the cavity. If there is any error, it cycles back to calculate the die rotation and cavity translation, converts it to pulses, and rotates the die and moves the cavity. Once the cavity and die are aligned mathematically, the Z depth previously measured is then read or a new depth is measured using the Z detector 56 and the appropriate Z stroke is calculated and converted to motor pulses to lower the bond head 24. The sequence is ended with the die being bonded at the location.

Figure 9:
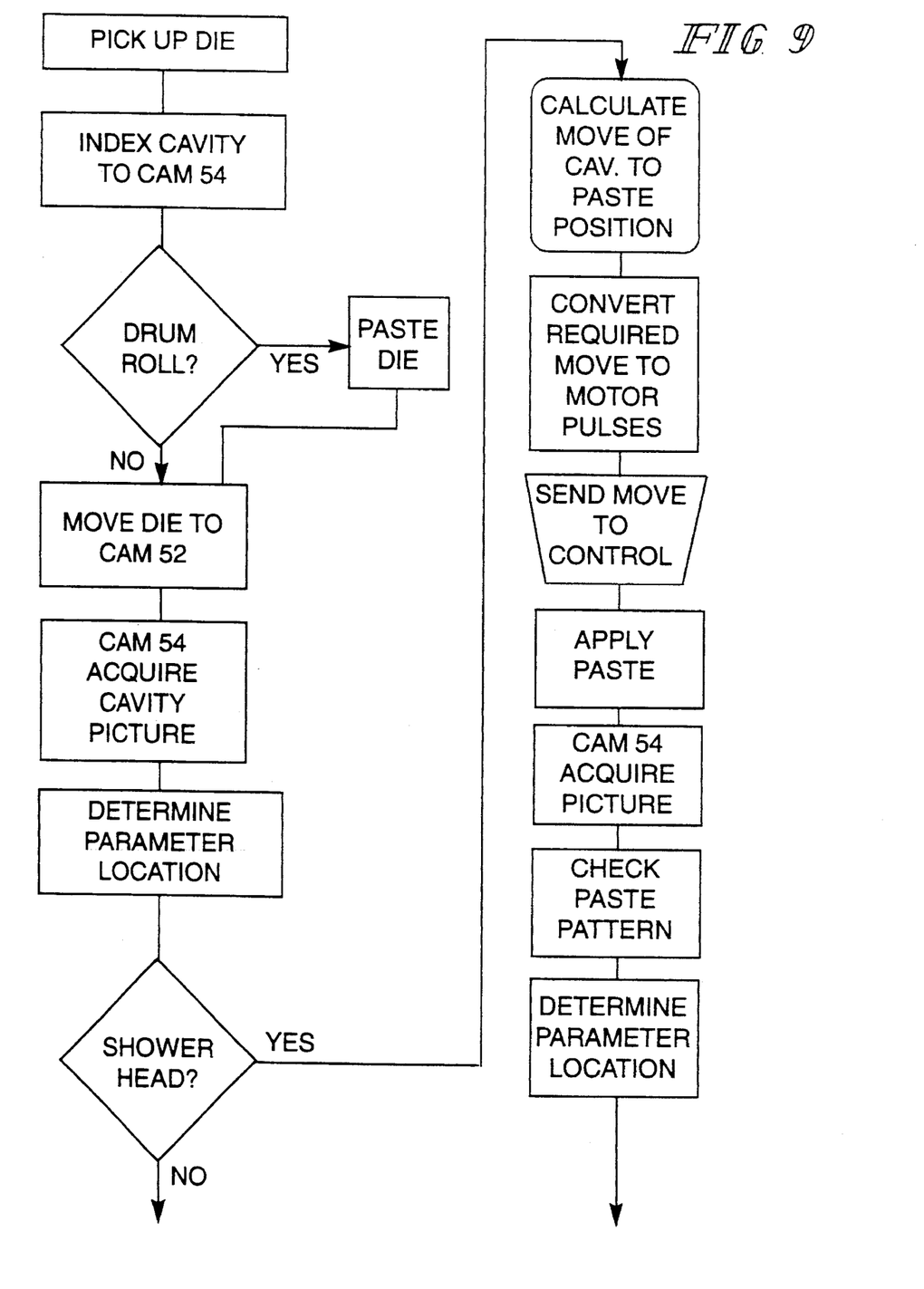
FIG. 9 is a flow diagram of the positioning and alignment method incorporating the principles of the present invention.

It should be noted that the quality control portion has not been included in the flow chart of FIG. 9. If the quality of the package is not acceptable, a new package index at the bond site. If a particular bond site is not acceptable, the package is again indexed to provide an appropriate bond site within the package within the field of view of the camera 54. In some situations, multiple dies may be provided within one package and, therefore, there will be multiple bond sites. Also, after bonding, the bond head 24 is moved out of the bond site and camera 54 acquires a picture of the bond to perform a post-bond inspection which include bond quality measured by pattern recognition system as well as X, Y and θ position from the picture acquired by bond camera 54. Also the bond line height or Z position and the planarity or tilt of the bonded die is measured by detector 56 making multiple Z readings of the die moved within the X or Y axis. The sequence is then repeated as discussed above.

Although the present invention has been described and illustrated in detail, it is to be clearly understood that the same is by way of illustration and example only, and is not to be taken by way of limitation. The word paste as used in the specification and claims is to mean any adhesive or binding material. Although a package or ceramic package having a cavity and carried by a boat has been used as an example, the present system can be used with any substrate for example, a printed circuit, lead frame, etc. The spirit and scope of the present invention are to be limited only by the terms of the appended claims.

What is claimed:

1. An apparatus for aligning and positioning an electronic die on a substrate in a bonder comprising:

first transport means for transporting a substrate to a bonding location;

first sensor means for sensing the Z coordinate of said substrate and a die bonded on said substrate at said bonding location;

second transport means for transporting a die from a supply location to a bond site on said substrate;

second sensor means for sensing the Z coordinate of said second transport means; and control means for correlating sensed coordinates from said first and second sensor means and adjusting the Z of said second transport means and said substrate relative to each other to place said die on a preselected bond site on said substrate and for measuring the Z position of the bonded die using said sensed coordinates from said first sensor means.

2. An apparatus according to claim 1 wherein said control means determines the thickness of a bonded die using said first sensor means.

3. An apparatus according to claim 1 wherein said control means measures planarity of a bonded die using said first sensor means.

4. An apparatus according to claim 1 wherein said control means measure planarity of said substrate using said first sensor means.

5. An apparatus for aligning and positioning an electronic die on a substrate in a bonder comprising:

first transport means for transporting a substrate to a bonding location;

first sensor means for sensing the Z coordinate of said substrate at said bonding location;

second transport means for transporting a die from a supply location to a bond site on said substrate;

second sensor means for sensing the Z coordinate of said second transport means;

a Z reference position separate from said second transport means; and control means for calibrating said first and said second sensor means to said reference position, correlating sensed coordinates from said first and second sensor means and adjusting the Z of said second transport means and said substrate relative to each other to place said die on a preselected bond site on said substrate.

6. An apparatus for aligning and positioning an electronic die on a substrate in a bonder comprising:

first transport means for transporting a substrate to a bonding location;

first sensor means for sensing the Z coordinate of said substrate at said bonding location;

second transport means for transporting a die from a supply location to a bond site on said substrate;

second sensor means for sensing the Z coordinate of said second transport means;

a Z reference position; and control means for positioning said die on said reference position with said second transport and determining the thickness of the die and for correlating sensed coordinates from said first and second sensor means and the determined thickness of the die and adjusting the Z of said second transport means and said substrate relative to each other to place said die at a preselected bond site on said substrate.

7. An apparatus according to claim 6 wherein said control means determines the thickness of a die on said second transport means by measuring the Z value of the second transport means with the die on said reference position using said first sensor means.

8. An apparatus according to claim 6 wherein said control means determines the thickness of a die on said second transport means by measuring the Z value of the second transport means with the die on said reference position using said second sensor means.

* * * * *